United States Patent
Rachala et al.

(10) Patent No.: US 10,547,273 B2
(45) Date of Patent: Jan. 28, 2020

(54) COMPACT SUPPLY INDEPENDENT TEMPERATURE SENSOR

(71) Applicant: Advanced Micro Devices, Inc., Sunnyvale, CA (US)

(72) Inventors: Ravinder Reddy Rachala, Austin, TX (US); Stephen V. Kosonocky, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 53 days.

(21) Appl. No.: 15/796,048

(22) Filed: Oct. 27, 2017

(65) Prior Publication Data
US 2019/0131928 A1 May 2, 2019

(51) Int. Cl.
*G01K 7/01* (2006.01)
*H03K 3/03* (2006.01)
*H03B 5/04* (2006.01)

(52) U.S. Cl.
CPC .............. *H03B 5/04* (2013.01); *G01K 7/01* (2013.01); *H03K 3/0315* (2013.01)

(58) Field of Classification Search
CPC .......... G01K 3/005; G01K 7/01; G01K 7/203; G01K 7/245; G01K 7/32; H03B 5/04; H03K 3/0315; H03K 3/0322; H03L 1/02
USPC ............................................. 331/57, 66, 176
See application file for complete search history.

(56) References Cited

U.S. PATENT DOCUMENTS

| | | | | |
|---|---|---|---|---|
| 4,853,654 A * | 8/1989 | Sakurai | .................. | H03K 3/011 331/57 |
| 5,499,214 A * | 3/1996 | Mori | ..................... | G11C 11/406 331/57 |
| 5,544,120 A * | 8/1996 | Kuwagata | ............. | G11C 11/406 331/175 |
| 6,078,208 A * | 6/2000 | Nolan | ...................... | G01K 7/01 327/512 |
| 6,281,760 B1 * | 8/2001 | Koelling | .................. | G11C 7/04 331/179 |
| 6,304,148 B1 * | 10/2001 | Nomura | .................... | G11C 7/04 326/95 |
| 7,295,079 B2 | 11/2007 | Wu et al. | | |
| 2001/0028278 A1* | 10/2001 | Ooishi | ..................... | G05F 3/262 331/57 |
| 2004/0108907 A1* | 6/2004 | Lim | ......................... | G01K 7/01 331/66 |
| 2006/0138582 A1* | 6/2006 | Han | .......................... | G01K 7/01 257/467 |
| 2006/0226921 A1* | 10/2006 | Hsu | ......................... | H03K 3/011 331/57 |
| 2010/0189160 A1* | 7/2010 | Kim | ......................... | G01K 1/02 374/170 |

(Continued)

*Primary Examiner* — Levi Gannon
(74) *Attorney, Agent, or Firm* — Zagorin Cave LLP

(57) ABSTRACT

A temperature sensor has a first transistor with a gate voltage tied to maintain the first transistor in an off state with leakage current flowing through the transistor, the leakage current varying with temperature. A second transistor is coupled to the first transistor and receives a gate voltage to keep the second transistor in an on state. A current mirror mirrors the leakage current and supplies a mirrored current used to control a frequency of an oscillator signal varies with the mirrored current. The temperature of the first transistor is determined based the frequency of the oscillator signal.

18 Claims, 6 Drawing Sheets

(56) References Cited

U.S. PATENT DOCUMENTS

2012/0140792 A1\* 6/2012 Yeh .......................... G01K 7/01
  374/170
2016/0341604 A1  11/2016 Kosonocky
2019/0025135 A1\* 1/2019 Zhang ....................... G05F 1/59

\* cited by examiner

COMPACT SUPPLY INDEPENDENT TEMPERATURE SENSOR

BACKGROUND

Description of the Related Art

Integrated circuits have utilized diode-based thermal sensors to sense temperature of the integrated circuit. Temperature sensors allow integrated circuits such as graphics processing units and central processing units (CPUs) to operate within desired temperature ranges. Absent such sensors, potentially damaging high temperature conditions could occur.

The diode has a relatively linear temperature response and a relatively high temperature coefficient. However, diode based thermal sensors take up significant area in the integrated circuit and require sensitive analog routing susceptible to high speed analog noise coupling on to the sensitive analog routes. Further, the large size of the diodes limits the number of sensors that can be deployed across the integrated circuit die. Having few sensors in large high-speed circuit blocks risks failing to detect the hot spots on the die. As a result, systems operate with a thermal margin to account for possible undetected hotspots, which can adversely affect both performance and reliability.

SUMMARY OF EMBODIMENTS OF THE INVENTION

Accordingly, in order to improve thermal sensors, an embodiment provides a method that includes passing a current that varies with temperature through a first transistor. A current mirror circuit mirrors the current passing through the transistor and generates a mirrored current. An oscillator is controlled based on the mirrored current and supplies an oscillator output signal having a frequency that varies with the temperature. The temperature can be determined from the frequency of the oscillator output signal.

In another embodiment an apparatus includes a first transistor configured to pass a current that varies with temperature. A current mirror circuit is coupled to the first transistor to mirror the current and supply a mirrored current. An oscillator is coupled to the mirrored current and supplies an oscillator output signal having a frequency that varies according to the mirrored current.

In another embodiment, a first transistor has a gate voltage tied to a first power supply node to maintain the first transistor in an off state with leakage current flowing through the transistor, the leakage current varying with temperature. A second transistor is coupled to the first transistor and coupled to receive a gate voltage to keep the second transistor in an on state. A current mirror circuit is coupled between a second power supply node and the second transistor and is configured to mirror the leakage current and supply a mirrored current. An oscillator is coupled to supply an oscillator output signal having a frequency that varies with the mirrored current.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein rely on temperature sensitive current passing through a transistor. That is, the amount of current passing through the transistor varies with temperature. In an embodiment, the transistor is maintained in an off state and the current through the transistor is leakage current. Relying on leakage current allows high resolution, especially at higher temperatures, which is typically the operating range of concern. The current through the transistor is mirrored and used to drive an oscillator. The frequency of the oscillator is exponentially related to the temperature. Embodiments described herein take up a smaller area (less than 5% of current diode sensors), do not require a bandgap circuit, or precise control of threshold voltage of a transistor, which can be challenging to achieve in ultra-deep sub-micron technologies.

Figure 1:
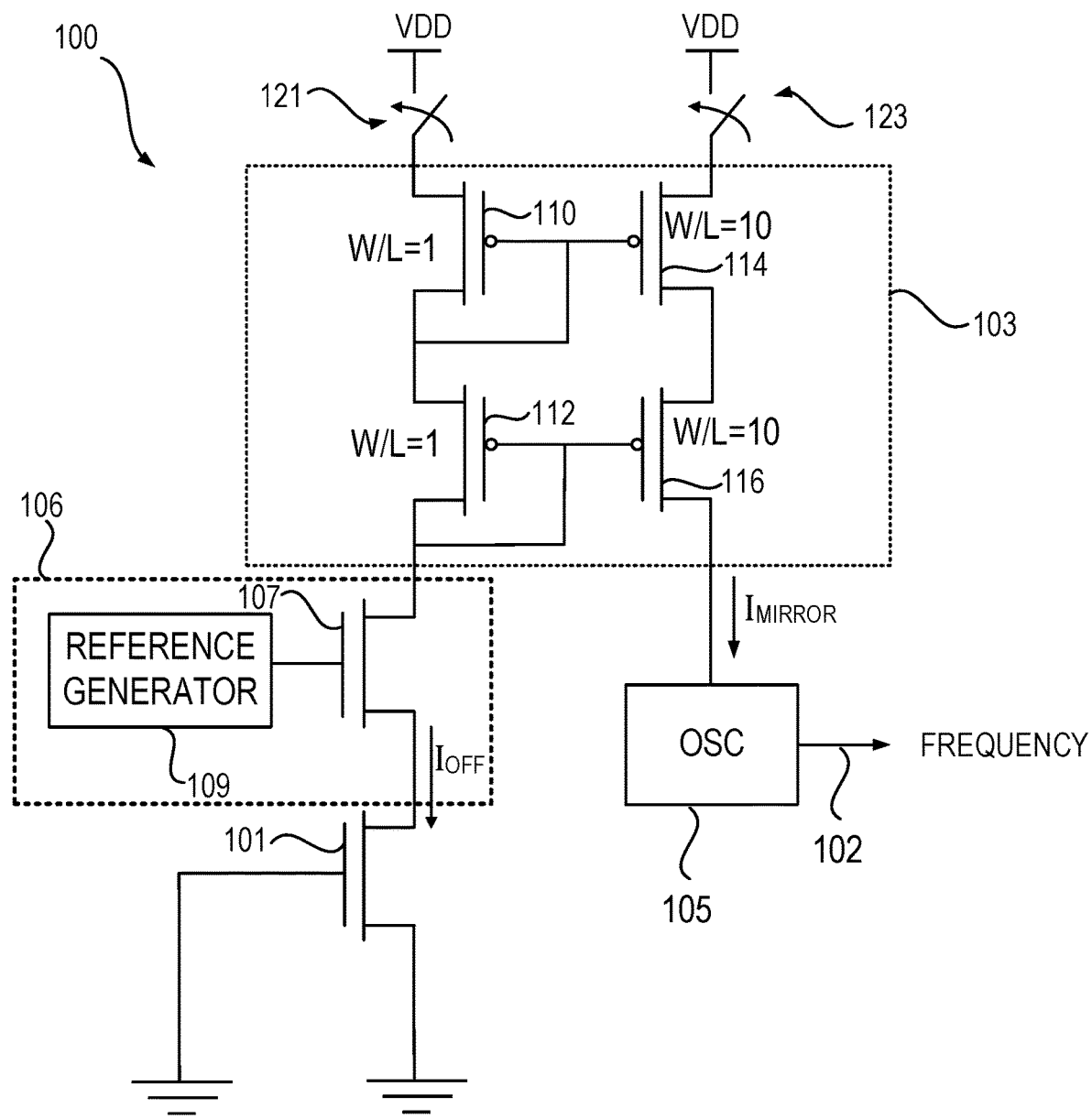
FIG. 1 illustrates a temperature sensor circuit according to an embodiment.

Referring to FIG. 1, the temperature sensor circuit 100 outputs an oscillator signal 102 whose frequency is exponentially related to temperature. The temperature sensor circuit 100 includes a "leaker" device 101, which in the illustrated embodiment is an NMOS device having its gate coupled to ground. The temperature sensor also includes a current mirror 103 that functions to amplify the leakage current $I_{OFF}$ and supply the amplified leakage current $I_{MIRROR}$ to the oscillator 105. In an embodiment, the oscillator 105 is a current controlled oscillator. Other embodiments may convert the current $I_{MIRROR}$ to a voltage and implement a voltage controlled oscillator (VCO).

The temperature sensor circuit 100 utilizes a circuit 106 to maintain the drain to source voltage ($V_{DS}$) across the leaker device constant even with supply voltage variations. The circuit 106 includes transistor 107 and the reference generator 109 supplying a gate signal to keep transistor 107 in an on state. Providing a constant $V_{DS}$ across the leakage transistor ensures that the variation in leakage current depends primarily on variations in temperature and the dependence on voltage variations is negligible since the circuit 106 keeps the "leaker" device at constant current for any supply voltage at a particular temperature. Current through the "leaker" device varies substantially only with temperature and increases exponentially with increasing temperature.

Figure 2A:
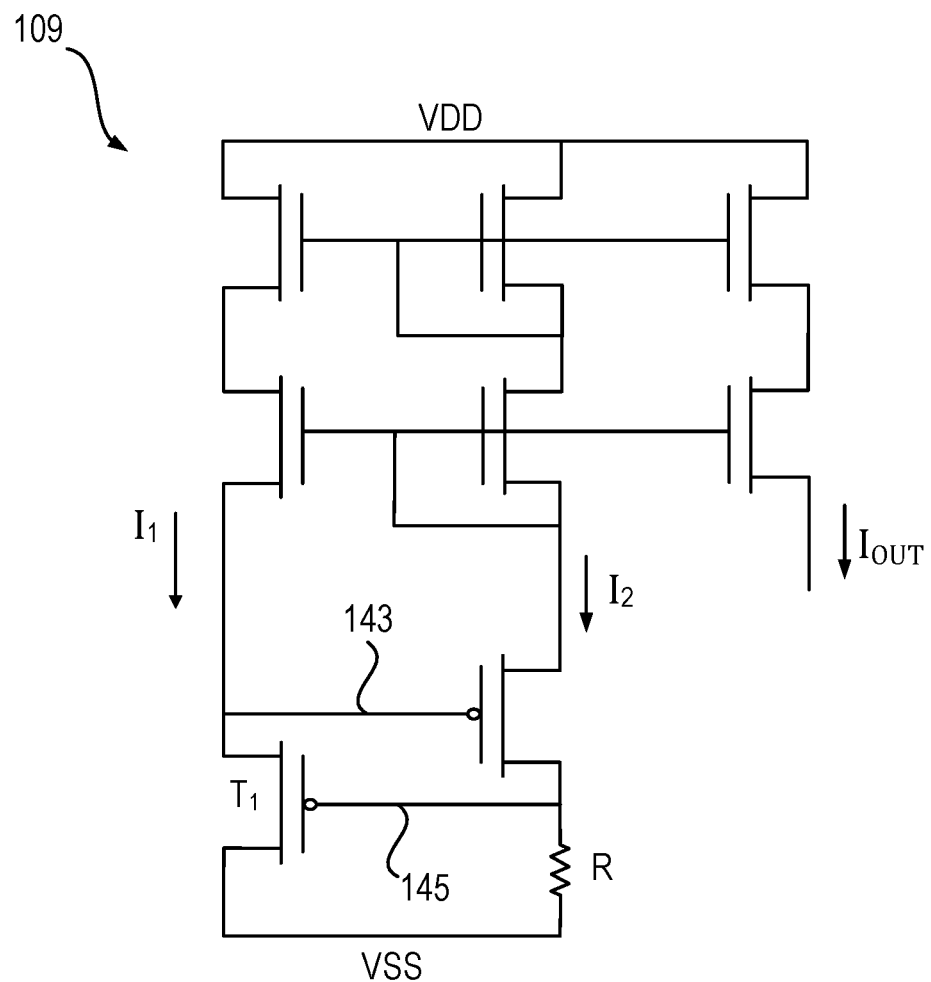
FIG. 2A illustrates an example of a reference generator used in the temperature sensor circuit of FIG. 1.

FIG. 2A illustrates an example of a reference generator 109 used in an embodiment. The reference generator 109 illustrated in FIG. 1B is a variation of a Vth referenced self-bias circuit. Based on the accuracy requirements for particular embodiments, the reference generator can be sourced with a constant supply such as 1.2V fixed or a variable supply voltage. The voltage supplied to the gate of transistor 107 (see FIG. 1) can be supplied from, e.g., node 143 or 145 of the reference generator 109. In the circuit of FIG. 2A, $$I_2 = \frac{V_{GS1}}{R} = \frac{V_{TH+}\sqrt{\frac{2I_1}{\mu_n C_{ox}\left(\frac{W}{L}\right)1}}}{R} \text{ and } I_1 = I_2 = I_{out} \approx \frac{V_{TH}}{R},$$

where $V_{GS1}$ is the gate to source voltage of transistor $T_1$ and $(W/L)_1$ is the width/length ratio of transistor $T_1$.

Referring again to FIG. 1, the MOSFET leakage current $I_{off}$ is an exponential that can be determined as $$I_{off} = 100\frac{W}{L} e^{-\frac{qV_{th}}{\eta \cdot k \cdot T}}.$$

Depending on the threshold voltage definition the number 100 in the equation can vary. In an embodiment, the threshold voltage is being defined as gate voltage at which $I_{ds}$ (drain current) is 100 nA. $I_{off}$ (leakage current) increases exponentially with temperature. W and L are width and length of the transistor, η is process dependent, $V_{th}$ is threshold voltage, T is the temperature in kelvin, q (electron charge) and k (Boltzmann constant) are known standard values. The value of η can be determined as $$\eta = 1 + \frac{C_{Dep}}{C_{Ox}}.$$

The current mirror 103 includes transistor 110, 112, 114, and 116. In the illustrated embodiment, the width to length ratios of transistors 114 and 116 are ten times greater than the width to length ratios of transistors 110 and 112 to provide the required gain for the mirrored current $I_{MIRROR}$. The gain allows a very low leakage current to control the frequency of oscillations in oscillator 105. Note that a complementary circuit can be implemented by switching from NFET to PFET for leaker transistor 101 (with gate tied to VDD) and using an NFET based current mirror circuit.

Figure 2B:
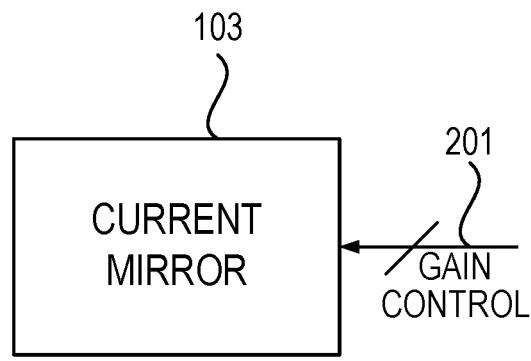
FIG. 2B illustrates a current mirror receiving a gain control signal.

While shown as single transistors, the transistors 114 and 116 may be formed of multiple transistors to allow the width to length (W/L) ratio to be programmable. Thus, as shown in FIG. 2B, a gain control signal 201 can turn on/off certain of the transistors 114 and 116 to program the gain to an appropriate value. For example, transistors 114 and 116 may each represent eight transistors. The gain control signal enables an appropriate number of the eight transistors to set the gain to a desired level. That may be accomplished, e.g., by using fuses to include or exclude particular transistors from the mirror circuit based on the gain control signal.

The temperature circuit may be calibrated, e.g., by heating the integrated circuit to different temperature values and determining the temperature reading based on the temperature sensor. In an embodiment a thermal diode is connected to an external reader and serves as a reference. In calibration, the die is held at constant ambient temperature and is powered to enable the sensors for calibration. The sensor readings across the die are recorded including the thermal diode. Offsets (from the reference) seen at each sensor are stored on die. Sensor circuits are calibrated, e.g., at two temperature points.

Having a programmable gain allows variations in manufacturing to be dealt with effectively. Controlling the amplification of the leakage current $I_{OFF}$ keeps the resulting mirrored current $I_{MIRROR}$ in a desirable range across all temperatures (e.g., −25 C to 140 C) and process corners. As is known in the art, the integrated circuit manufacturing process is subject to variations, e.g., typical, slow, and fast process corners. The process corner can affect the leakage current of the leakage device 101. If the leakage current is too low, the amplified current may be unable to drive the oscillator. Hence, increasing the gain in the current mirror can allow even low leakage currents to drive the oscillator. On the other hand, if the leakage current is high from a fast process corner, the gain in the current mirror can be reduced to save power.

Figure 3:
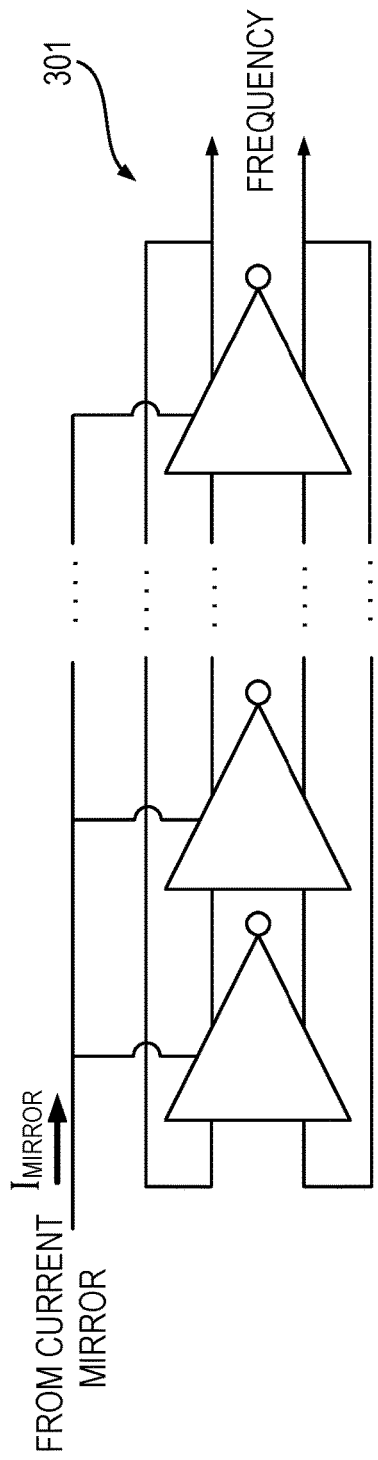
FIG. 3 illustrates a high level block diagram of an embodiment of an oscillator.

FIG. 3 illustrates an embodiment 301 of the oscillator 105, where the oscillator is a differential current controlled ring oscillator. The mirrored current $I_{MIRROR}$ is exponentially related to temperature and the frequency of the output signal from the oscillator maintains an exponential relationship to temperature. The frequency of the oscillator is linearly related to the current.

Figure 4A:
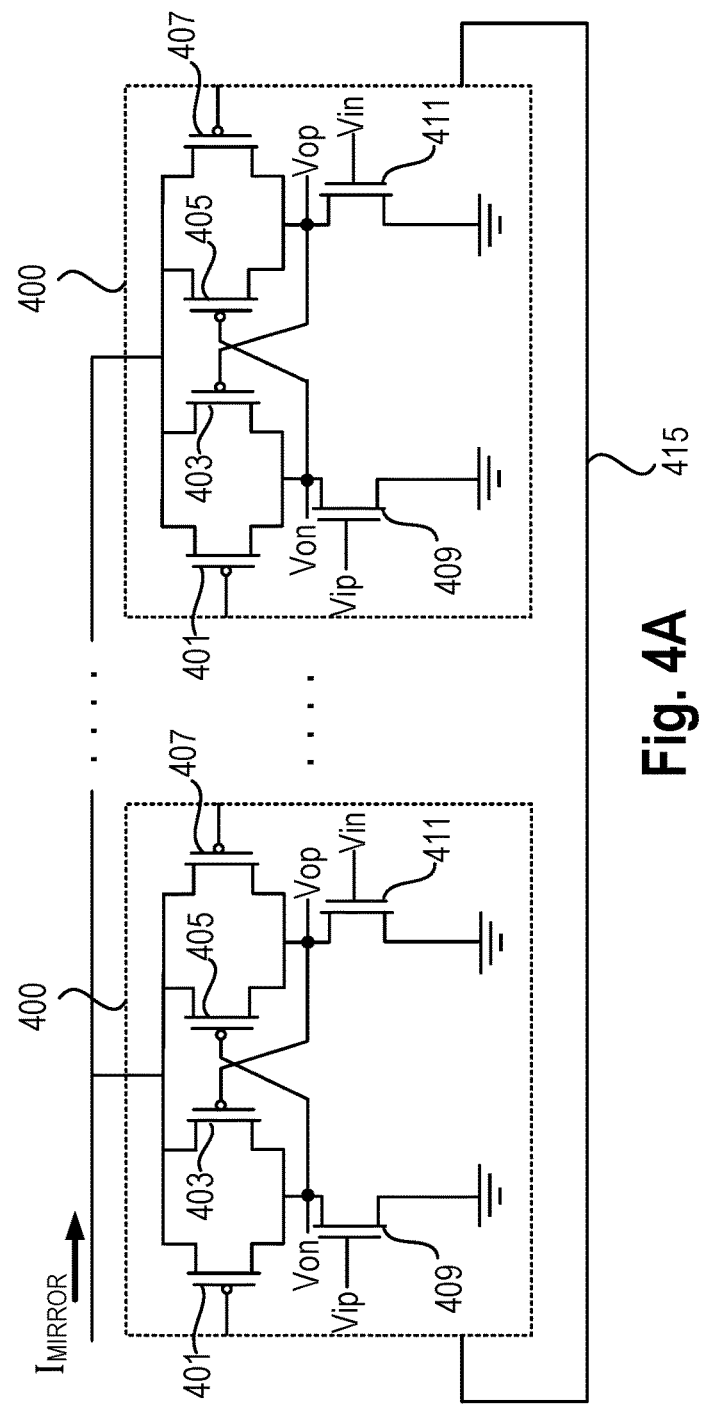
FIG. 4A illustrates details of an embodiment of oscillator stages.
Figure 4B:
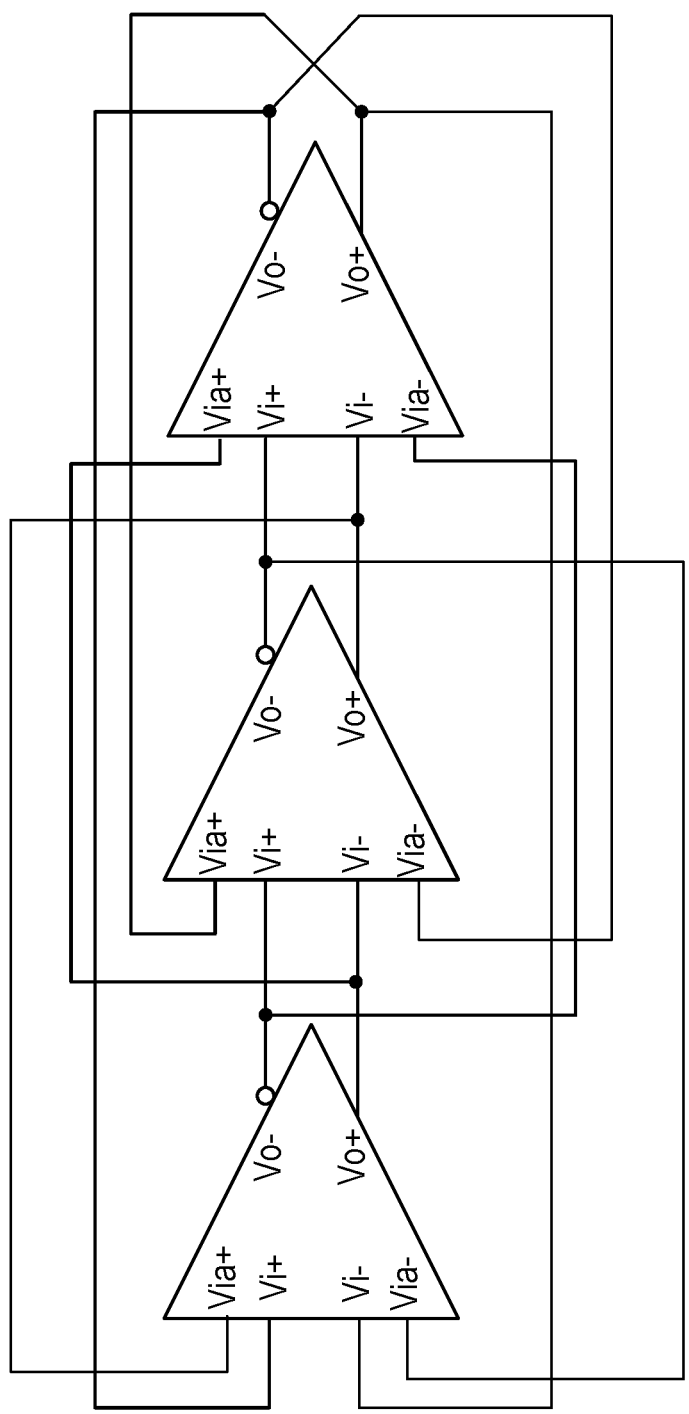
FIG. 4B illustrates a high level block diagram of an exemplary multiple feedback oscillator.

FIG. 4A illustrates an embodiment of a ring oscillator circuit with oscillator stages 400. Each stage includes PMOS transistors 401, 403, 405, and 407 and pulldown NMOS transistors 409 and 411. Each stage provides a cross coupled delay configuration, where the frequency through the oscillator depends on the delay of each stage. The embodiment of FIG. 4A implements a multiple feedback loop oscillator structure having its oscillator frequency based on the mirror current $I_{MIRROR}$. In the example oscillator structure, the gates of transistors 401 and 407 in stage n are coupled to the outputs of an oscillator stage n−2 stages away. The inputs to the gates of transistors 409 and 411 are coupled to the immediately preceding stage (n−1). The feedback signal 415 generically represents that the oscillator stages are coupled in a loop. FIG. 4B illustrates a high level block diagram of a three stage example of a multiple feedback loop oscillator structure that may be utilized. Numerous other oscillator circuits may be used according to the needs of the particular embodiment.

Figure 5:
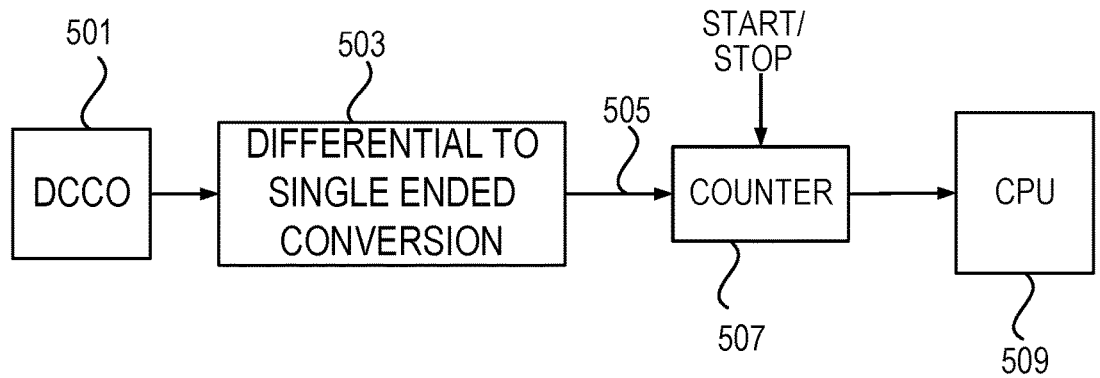
FIG. 5 illustrates a block diagram of aspects of a temperature sensor system according to an embodiment.

Referring to FIG. 5, in an embodiment the differential current controlled oscillator 501 supplies its differential output to a differential to single ended conversion block 503. In embodiments where the oscillator is not differential, the conversion block is omitted. The conversion block supplies a signal 505 having a frequency that is exponentially related to temperature. A counter 507 counts the number of cycles of oscillator 501 that occurs in sampling window determined by the start/stop signal. The sampling window is a predetermined time period based on a reference clock of a known frequency. Thus, e.g., the counter 507 can count for one μs and then be stopped and cleared. The count value corresponds to the frequency during that microsecond. The count value may be supplied to a CPU 509 or other calculation logic that uses a logarithmic function to recover the temperature based on the exponential relationship between $I_{OFF}$ and temperature described above. Given the exponential relationship between frequency and temperature one can derive a linear fit between temperature and log (frequency) in accordance with the following equation.

Temp=$m$×log(Frequency)+$C$

Calibration measurements at two temperature points can be used to determine slope (m) and intercept (C).

Figure 6:
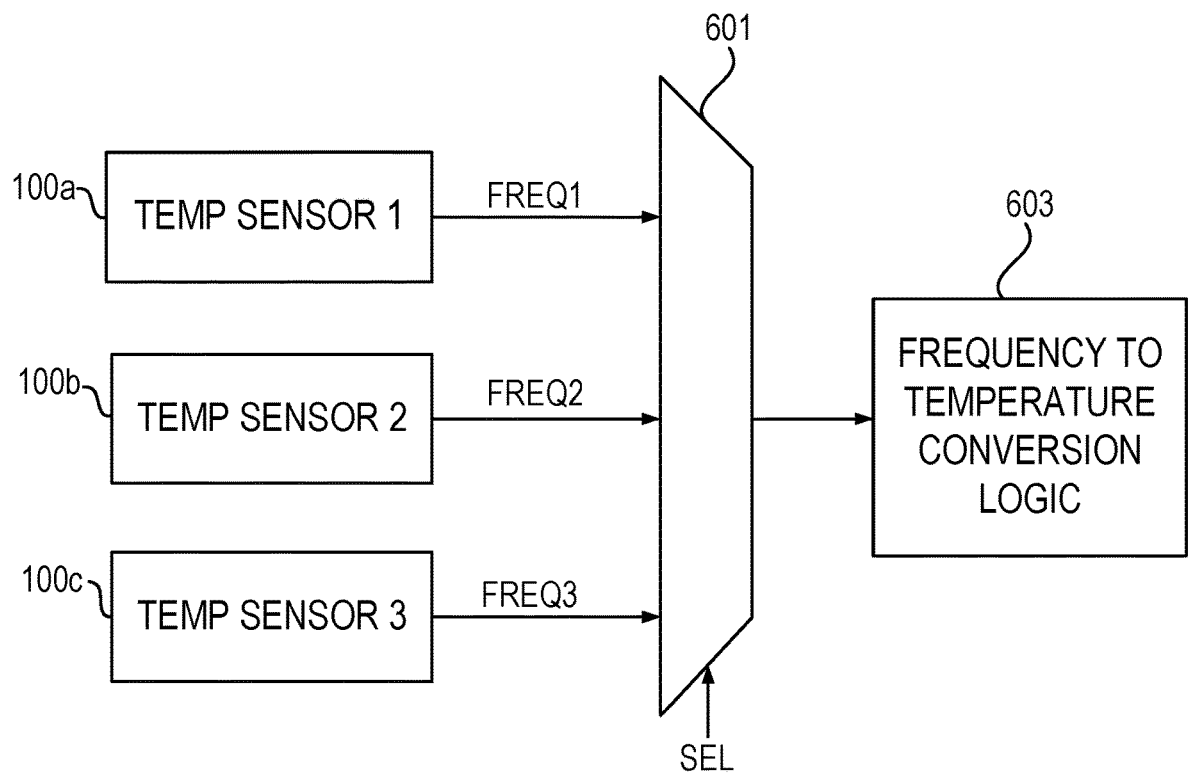
FIG. 6 illustrates an embodiment in which one of multiple temperature sensor circuits is selected.

FIG. 6 illustrates an embodiment using multiple temperature sensors 100a, 100b, 100c having leakage transistors with different threshold voltages and thus different leakage currents. That can result in oscillator output signals with different frequencies, FREQ1, FREQ2, and FREQ3. The most accurate temperature sensor for a particular process corner may be selected by selector logic 601 and supplied to frequency to temperature conversion logic 603 to determine the temperature based on the selected oscillator output signal.

Figure 7:
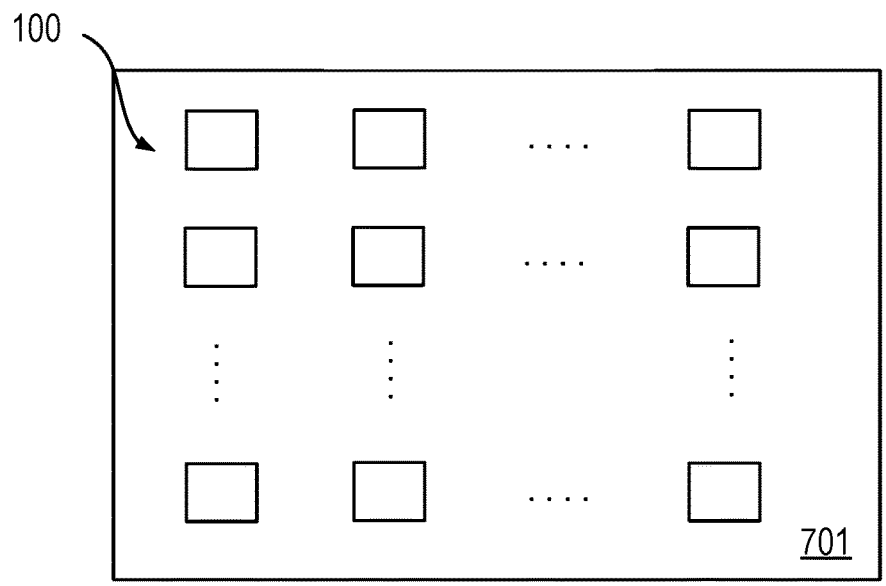
FIG. 7 illustrates an integrated circuit block with multiple temperature sensors.

Embodiments of the temperature sensor circuit described herein are based on the leakage current of a MOSFET and is independent of voltage. Integration of the circuit is easier than diode based solutions. Embodiments of the temperature sensor circuit described herein work on a regular digital supply that varies, e.g., from 0.5 v-1.2 v. Referring to FIG. 7, the small size of the current sensor described herein, allows placement of multiple temperature sensors 100 per circuit block 701. The circuit block may be a CPU or GPU core or other region of an integrated circuit. A higher number of temperature sensors per circuit block generates a more accurate temperature profile of the area being monitored. Better thermal awareness reduces risk of missed hotspots and thus increases reliability and increases performance because less thermal margining is required.

Referring back to FIG. 1, embodiments use switches 121 and 123 to shut off the supply voltage when the temperature sensor is not being used. Temperature moves relatively slowly so a reading every millisecond or longer can be more than sufficient to track thermal changes in integrated circuits. Switches 121 and 123 are opened when the temperature sensor is not in use to save power. When control logic determines a temperature reading is needed, the control logic closes the switches to enable operation of the temperature sensor.

Figure 8:
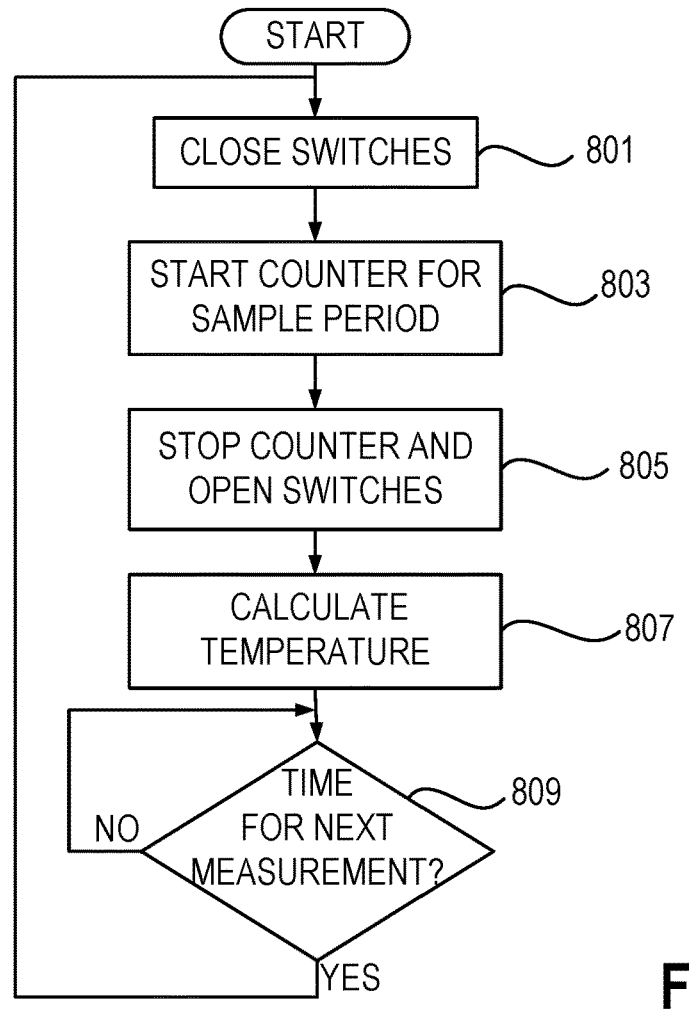
FIG. 8 illustrates a flow diagram of operation of an embodiment of a temperature sensor system.

FIG. 8 illustrates an example flow diagram of operation of the temperature sensor system. At 801 the control logic causes the switches 121 and 123 (FIG. 1) to close to provide power to the temperature sensor. The control logic may be hardware such as a state machine and counters, software operating on programmable logic such as a processor, or any combination of hardware and software to provide the necessary control. At 803 the counter starts to count cycles of the oscillator. The count lasts for the sample period and then the counter is stopped in 805 and the switches are opened to save power until the next measurement cycle. The calculation logic (processor or other calculation hardware) calculates the temperature in 807 using a logarithmic function and other appropriate arithmetic based on the relationship between oscillator frequency and mirrored current. Power management hardware and software (not shown) can then determine appropriate action to take, if any, based on the sensed temperature. For example, the temperature reading may allow the system to increase performance by using higher voltage and/or frequency or otherwise increase processing capability, or force a decrease in performance by, e.g., lowering voltage and/or frequency or otherwise decreasing processing capability to reduce temperature. Finally, in 809 the system waits until the time for the next temperature measurement, e.g., 1 millisecond, and then returns to power up the temperature sensor in 801 and repeat the temperature measurement process.

While circuits and physical structures have been generally presumed in describing embodiments of the invention, it is well recognized that in modern semiconductor design and fabrication, physical structures and circuits may be embodied in a computer readable medium as data structures for use in subsequent design, simulation, test, or fabrication stages. For example, such data structures may encode a functional description of circuits or systems of circuits. The functionally descriptive data structures may be, e.g., encoded in a register transfer language (RTL), a hardware description language (HDL), in Verilog, or some other language used for design, simulation, and/or test. Data structures corresponding to embodiments described herein may also be encoded in, e.g., Graphic Database System II (GDSII) data, and functionally describe integrated circuit layout and/or information for photomask generation used to manufacture the integrated circuits. Other data structures, containing functionally descriptive aspects of embodiments described herein, may be used for one or more steps of the manufacturing process.

Computer-readable media include tangible computer readable media, e.g., a disk, tape, or other magnetic, optical, or electronic storage medium. In addition to computer-readable medium having encodings thereon of circuits, systems, and methods, the computer readable media may store instructions as well as data that can be used to implement embodiments described herein or portions thereof. The data structures may be utilized by software executing on one or more processors, firmware executing on hardware, or by a combination of software, firmware, and hardware, as part of the design, simulation, test, or fabrication stages.

The description of the embodiment set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. A method comprising:
    passing a current that varies with temperature through a first transistor;
    mirroring the current in a current mirror circuit and generating a mirrored current;
    controlling an oscillator based on the mirrored current and supplying an oscillator output signal having a frequency that varies with the temperature; and
    maintaining a drain to source voltage across the first transistor substantially constant with variations in supply voltage.

2. The method as recited in claim 1 wherein the frequency of the oscillator output signal is exponentially related to the current.

3. The method as recited in claim 1 further comprising:
    determining the temperature based on the oscillator output signal.

4. The method as recited in claim 1 wherein the oscillator is a current controlled oscillator.

5. The method as recited in claim 1 further comprising supplying the first transistor with a first gate voltage to keep the first transistor in an off state and wherein the current is a leakage current associated with the first transistor.

6. The method as recited in claim 1 further comprising supplying the first transistor with a first gate voltage having a value below a threshold voltage of the first transistor.

7. The method as recited in claim 1 further comprising supplying a second transistor disposed between the current mirror circuit and the first transistor with a gate voltage to keep the second transistor in an on state.

8. An apparatus comprising:
a first transistor configured to pass a current that varies with temperature, wherein a gate of the first transistor is coupled to receive a first gate voltage to keep the first transistor in an off state;
a current mirror circuit coupled to the first transistor to mirror the current and supply a mirrored current;
a second transistor coupled in series between the current mirror circuit and the first transistor and configured to pass the current that varies with temperature to the first transistor, the second transistor having a second transistor gate coupled to a voltage node to keep the second transistor in an on state; and
an oscillator coupled to receive the mirrored current and supply an oscillator output signal having a frequency that varies according to the mirrored current.

9. The apparatus as recited in claim 8 wherein the oscillator is a current controlled oscillator.

10. The apparatus as recited in claim 8 wherein a gate of the first transistor is coupled to receive a first gate voltage to keep the first transistor in an off state.

11. The apparatus as recited in claim 10 wherein the first gate voltage has a value below a threshold voltage of the first transistor.

12. The apparatus as recited in claim 8 wherein the current is leakage current through the first transistor while the first transistor is in an off state.

13. The apparatus as recited in claim 8 wherein a gain of the current mirror circuit is programmable.

14. The apparatus as recited in claim 8 further comprising a circuit, including the second transistor, to maintain a substantially constant drain to source voltage across the first transistor even with supply voltage variations.

15. An apparatus comprising:
a first temperature sensor circuit including,
a first transistor having a gate voltage tied to a first power supply node to maintain the first transistor in an off state and supply a leakage current, the leakage current varying with temperature;
a second transistor coupled to the first transistor and coupled to receive a gate voltage to keep the second transistor in an on state;
a current mirror circuit coupled between a second power supply node and the second transistor and configured to mirror the leakage current flowing through the first transistor and the second transistor and supply a mirrored current;
an oscillator circuit coupled to supply a first oscillator output signal having a frequency that varies with the mirrored current; and
wherein the second transistor keeps a drain to source voltage of the first transistor substantially constant.

16. The apparatus as recited in claim 15 wherein the frequency of the first oscillator output signal has an exponential relationship to the leakage current.

17. The apparatus as recited in claim 15 further comprising a reference generator circuit to supply the gate voltage to the second transistor.

18. The apparatus as recited in claim 15 further comprising:
a second temperature sensor circuit including:
a third transistor having a gate voltage tied to the first power supply node to maintain the third transistor in an off state and supply a second leakage current, the second leakage current varying with temperature;
a fourth transistor coupled to the third transistor and coupled to receive a second gate voltage to keep the fourth transistor in an on state; and
a second current mirror circuit coupled between the second power supply node and the fourth transistor and configured to mirror current flowing through the third transistor and the fourth transistor and supply a second mirrored current;
a second oscillator circuit coupled to supply a second oscillator output signal having a frequency that varies with the second mirrored current; and
a select circuit to supply a selected output signal based on one of the first oscillator output signal and the second oscillator output signal.

* * * * *